(12) United States Patent
Grillettc (10) Patent No.: US 6,954,082 B2
(45) Date of Patent: Oct. 11, 2005

(54) METHOD AND APPARATUS FOR TESTING OF INTEGRATED CIRCUIT PACKAGE

(75) Inventor: Carlo Grillettc, San Carlos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/727,474

(22) Filed: Dec. 4, 2003

(65) Prior Publication Data

US 2005/0122127 A1 Jun. 9, 2005

(51) Int. Cl.[7] .............................................. G01R 31/26
(52) U.S. Cl. ....................................................... 324/765
(58) Field of Search ................................ 324/760, 754, 324/755, 757, 765, 158.1, 761, 763

(56) References Cited

U.S. PATENT DOCUMENTS 5,742,168 A * 4/1998 Kiyokawa et al. .......... 324/754
6,287,878 B1 * 9/2001 Maeng et al. ................ 438/15
6,597,189 B1 7/2003 Grilletto
6,750,646 B1 * 6/2004 Voss et al. ................ 324/158.1

OTHER PUBLICATIONS

IPC–9701, "Performance Test Methods and Qualification Requirements for Surface Mount Solder Attachments," IPC—Association Connecting Electronics Industries, cover page.

* cited by examiner

Primary Examiner—Vinh Nguyen
Assistant Examiner—Tung X. Nguyen
(74) Attorney, Agent, or Firm—L. Jon Lindsay (57) ABSTRACT

A method and apparatus for testing an integrated circuit (IC) package includes a printed circuit board (PCB) on which is mounted the IC package and which is removably connected (preferably perpendicular) to a motherboard. The IC package, the PCB and the motherboard are subjected to thermal, humidity and/or electrical test conditions.

20 Claims, 4 Drawing Sheets

METHOD AND APPARATUS FOR TESTING OF INTEGRATED CIRCUIT PACKAGE

BACKGROUND

Integrated circuits (ICs) are enclosed within IC "packages." The IC packages generally include a housing and external pads, connectors, leads or pins on outside edges or an outside surface of the housing. The external connectors are electrically connected to connection pads on IC dies for transferring electrical signals between the enclosed ICs and external components or devices with which the ICs interact. The IC packages are generally mounted on, Printed Circuit Boards (PCBs). A common practice is to directly surface attach the IC packages to the PCB with solder.

IC package designs differ based on a variety of characteristics, such as size, arrangement of external connectors and materials of construction, among many other characteristics. Each IC package must be appropriate for the enclosed IC, depending on IC characteristics such as die size, number of connection pads and amount of heat generated during operation of the chip, among other characteristics.

When a new IC or new IC package is developed, the package or IC/package combination must undergo testing to qualify the IC package to be used in a wide range of conditions. Additionally, particularly for surface-mounted IC packages, the IC package is tested when mounted on a representative circuit board that physically simulates the types of PCBs on which the IC package may be mounted. Such testing is necessary because the internal and external stresses and strains on a board-mounted IC package are different from a free-standing, or un-mounted, IC package. For example, it is important to determine the reliability of the "attach system" (i.e. solder balls, etc.) to the PCB. Also, the stresses on the IC die mounted within the IC package are different when the IC package is board-mounted compared to when the IC package is free-standing.

Tests that focus on the reliability or function of the connection between the IC package and the PCB are commonly referred to as "second-level" tests. On the other hand, tests that focus on internal portions of the IC package, when the IC packages are not attached to a PCB, are commonly referred to as "first-level" tests. However, the second-level tests commonly involve a combination of first-level and second-level issues, since the attached PCB can affect the IC die and other internal components of the IC package and the electrical signals applied to the external connectors must pass into the IC package to the IC die and back to the external connectors.

The second-level tests generally involve variations in electrical signal bias, ambient temperature, ambient humidity, etc. One commonly performed second-level IC package test is a thermal cycling test defined by IPC-9701, "Performance Test Methods and Qualification Requirements for Surface Mount Solder Attachments," by IPC-Association Connecting Electronics Industries of Northbrook, Ill. In some instances, the Temperature, Humidity, Bias test (or a more extreme version known as Highly Accelerated Stress Testing (HAST)), which is normally performed as a first-level test, is performed as a second-level test.

The IPC-9701 test generally subjects the surface-mounted IC package to thermal cycling conditions while electrical signals are supplied to the IC package. The electrical signals are monitored for failure conditions, such as an unacceptable increase in electrical resistance at any given temperature (e.g. −60° C. to +125° C.), which may occur due to thermal expansion and/or contraction of any portion of the IC package. Manual testing then determines the location of the failure condition.

Figure 1:
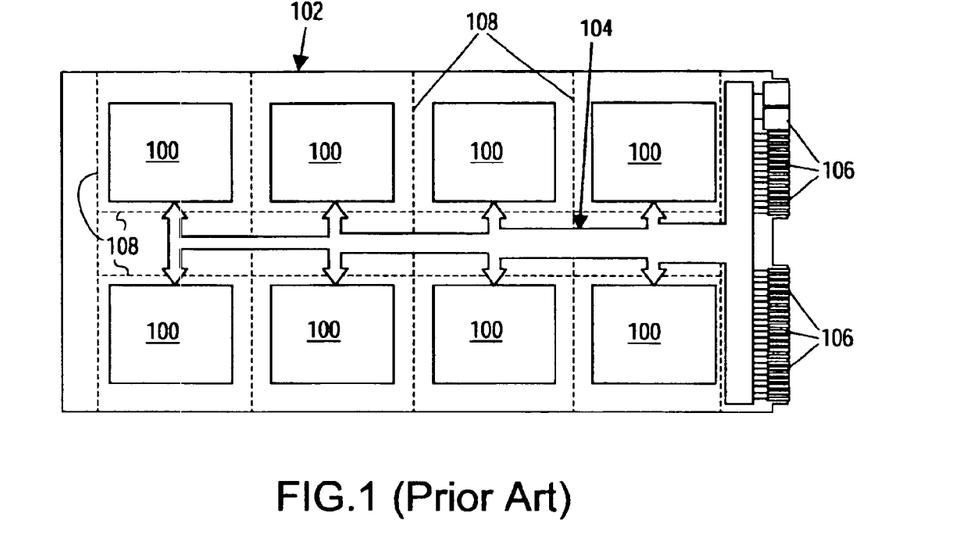
FIG. 1 is a plan view of a prior art motherboard populated with IC packages.

For the thermal-cycling portion of the testing, multiple IC packages 100 are surface mounted (e.g. soldered with a ball grid array) to a PCB 102, as shown in FIG. 1. Signal traces 104 are routed to the IC packages 100 from connectors 106 on the PCB 102. The PCB 102, populated with the IC packages 100, is placed in a thermal cycling chamber along with any other such populated PCBs, and the connectors 106 are connected to a data logger. The data logger supplies the electrical signals to the IC packages 100 through the connectors 106 and the signal traces 104. The data logger also monitors the response to the electrical signals (e.g. resistance, etc.) and the temperature in the chamber while the chamber cycles the temperature to which the PCB 102 and IC packages 100 are subjected.

To test the IC package, a relatively simple IC die is enclosed in the package and signals are transmitted through the package to a point on the IC die and back through the package from another point on the IC die. Thus, the external connectors, and associated internal components, are tested in pairs. However, the data logger typically has only a limited number of available channels for transmitting the electrical signals to the PCB 102. The IC packages 100, on the other hand, typically have many more external connectors than the data logger has channels. Therefore, for the thermal-cycling portion of the testing, the external connectors of the IC packages 100 are grouped together in multiple interconnected "chains" of external connectors. The length of each chain depends on the number of external connectors on each IC package 100, the number of IC packages 100 on the PCB 102 and the number of channels available in the data logger. Each channel of the data logger thus tests several chained-together external connectors and all of the internal pathways and connections associated therewith. The thermal-cycling portion of the testing, thus, gives a "gross" result for a general location of the failure condition. The manual portion of the testing, on the other hand, gives a "finer" result that associates the failure condition with one external connector or one pair of external connectors.

Figure 2:
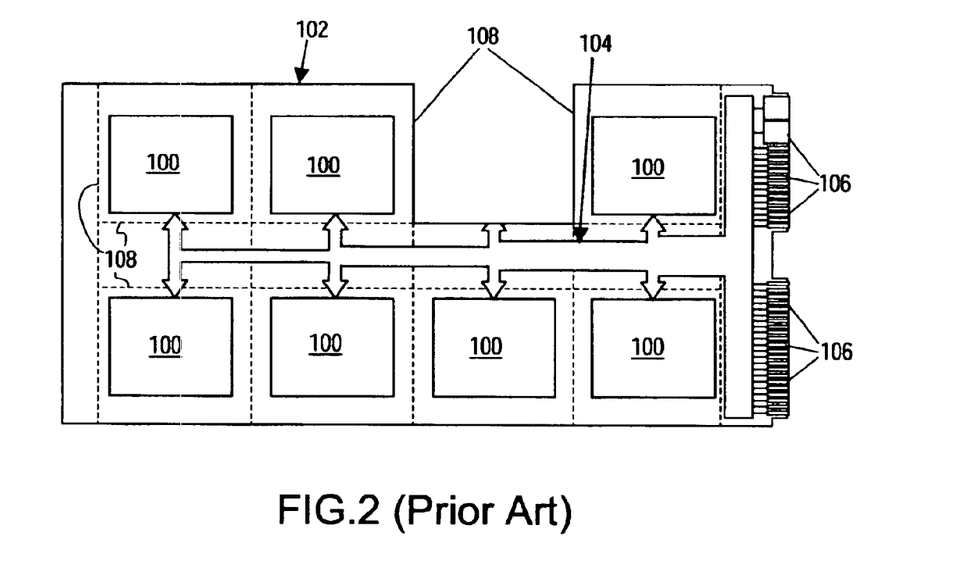
FIG. 2 is a plan view of the prior art motherboard shown in FIG. 1 with a portion cut out.

The PCB 102 includes cut lines 108 for cutting the mounted IC packages 100 from the PCB 102. In this manner, the IC packages 100 are removed from the PCB 102 without disconnecting the attach system (e.g. without slicing through the solder balls). The PCB 102 is thus left with a missing piece, as shown in FIG. 2. Therefore, after identifying an IC package 100 that is exhibiting potential failure conditions during the thermal-cycling portion of the testing, the PCB 102 is removed from the thermal cycling chamber and the identified IC package 100 is cut from the printed circuit board 102. The piece of the PCB 102 attached to the removed IC package 100 is then removed from or ground off the IC package 100 for the manual portion of the testing.

The identified IC package 100 is subjected to the manual testing to determine the cause or location of the failure condition. In this situation, a test operator manually probes each of the external connectors with a digital ohmmeter to test contact points and continuity of signals between two points, including resistance measurements.

The signal traces 104 are routed on the PCB 102 such that they will not be affected by the cutting of the PCB 102 upon the removal of any of the IC packages 100. Therefore, after removal of the identified IC package 100, the PCB 102, with the remaining IC packages 100 still mounted thereon, is generally returned to the thermal cycling chamber for further testing. The cutting of the PCB 102, however, takes away valuable time from the testing of the IC packages 100. Additionally, since the removed IC package 100 is permanently cut from the PCB 102, the removed IC package 100 cannot be returned to the thermal cycling portion of the testing to further subject the removed IC package 100 to additional thermal cycles and test for any other potential failures. The test operator, therefore, has to be sure that no additional thermal cycling is warranted on the identified IC package 100 before cutting it from the PCB 102. It is often difficult, however, to judge the right time to remove the identified IC package 100—too soon and some design weaknesses will go undetected, too late and test completion will be unnecessarily delayed.

The aforementioned HAST test generally subjects the IC packages to electrical bias testing in a relatively harsh environment (e.g. about 130° C. and about 85% relative humidity) to stress the IC packages to accelerate any potential electrochemical problems. The IC packages are placed in relatively expensive sockets that are mounted on a relatively expensive motherboard, and the populated motherboard is placed in a HAST test chamber. The IC packages are thus stressed in the test chamber for a period of time (e.g. about 100 hours). Then the populated motherboard is removed from the test chamber, and the IC packages are removed from the sockets. The IC packages are then connected to an Automated Test Equipment (ATE) and tested to locate any failure condition(s) that may have been caused by the electrical bias stressing. An improvement to this test apparatus and method is described in U.S. Pat. No. 6,597,189, filed Nov. 27, 2002 and issued Jul. 22, 2003 to the same inventor and assigned to the same assignee as the present invention. The disclosure of this US patent is incorporated herein by this reference. In the background thereof, the U.S. Pat. No. 6,597,189 describes a HAST test using sockets as briefly mentioned above. The U.S. Pat. No. 6,597,189 also describes a socketless test apparatus and method using test interposer cards on which the IC packages are mounted and which is an improvement over the socket-based tests.

The test interposer cards described in the U.S. Pat. No. 6,597,189 are appropriate PCB for testing the IC packages in a board-mounted situation. The test interposer cards have edge connectors on two opposing edges for connecting to mating female clamps on the motherboard with which the t st interposer cards and the IC packages are connected parallel to the motherboard.

It is with respect to these and other considerations that the present invention has evolved.

SUMMARY

Various embodiments of the present invention enable one or more of the following improvements and/or advantages among others that may not be specifically described. For example, the present invention involves test apparatus and methods that do not require cutting a PCB, or "motherboard," populated with multiple IC packages, in order to remove any of the IC packages therefrom. Instead, the IC packages are surface mounted to individual PCBs that are removably connected to the motherboard. Thus, the PCB-mounted IC packages can be quickly and easily removed from the motherboard (and a test chamber) by detaching the individual PCBs from the motherboard, so that the removed IC package/PCB combination can be individually tested, as needed. Any other PCB-mounted IC packages still attached to the motherboard can be quickly returned to testing (e.g. by placing the populated motherboard back in the test chamber). Furthermore, the removed IC package/PCB combinations can be quickly and easily returned to the motherboard (and the test chamber) for additional testing thereon. Also, the PCBs to which IC packages are surface mounted are connected perpendicular to the motherboard, allowing a larger number of the IC package/PCB combinations to be tested on one motherboard simultaneously than is possible with the prior art test apparatus.

Accordingly, a particular embodiment of the present invention involves a method of testing an IC package generally comprising mounting the IC package on a PCB (a.k.a. an interposer daughter card (IDC)) and removably connecting the PCB to a motherboard. The PCB-mounted IC package is then exposed to thermally varying test conditions and monitored for a test failure. If the IC package/PCB combination experiences the test failure, the PCB is removed from the motherboard and an electrical test is performed on the IC package/PCB combination to determine a location of the test failure.

Additionally, another particular embodiment involves a method of testing IC packages generally comprising mounting the IC packages on PCBs each having edge connectors on only one edge and removably connecting the PCBs to a motherboard perpendicular to the motherboard. A t st electrical bias is applied to the PCBs and the IC packages for a period of time. The PCBs are removed from the motherboard, and the IC package/PCB combinations are electrically tested to determine whether any of the IC packages have failed due to application of the test electrical bias.

Another particular embodiment involves an IC package testing apparatus comprising a plurality of PCBs and a motherboard. The PCBs are each capable of supporting an IC package to be tested. The PCBs are removably connected to the motherboard. The motherboard, the PCBs and the IC packages are adapted to be placed in a thermal test chamber within which the motherboard, the PCBs and the IC packages are subjected to thermal cycling conditions while electrical signals are applied to the IC packages through the motherboard and the PCBs and monitored for a failure condition. The motherboard and the PCBs are also adapted to be separated for electrical testing of the PCBs and the IC packages to determine a location of a cause of the failure condition.

Another particular embodiment involves an integrated circuit (IC) package testing apparatus comprising a plurality of PCBs and a motherboard. The PCBs each have edge connectors on only one edge and are capable of supporting an IC package to be tested. The PCBs are removably connected to the motherboard by edge card connection. The motherboard, the PCBs and the IC packages are adapted to be subjected to electrical bias test signals. The motherboard and the PCBs are also adapted to be separated for electrical testing of the PCBs and the IC packages to determine whether the electrical bias test signals caused a failure condition in any of the PCB-mounted IC packages.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

DETAILED DESCRIPTION

Figure 3:
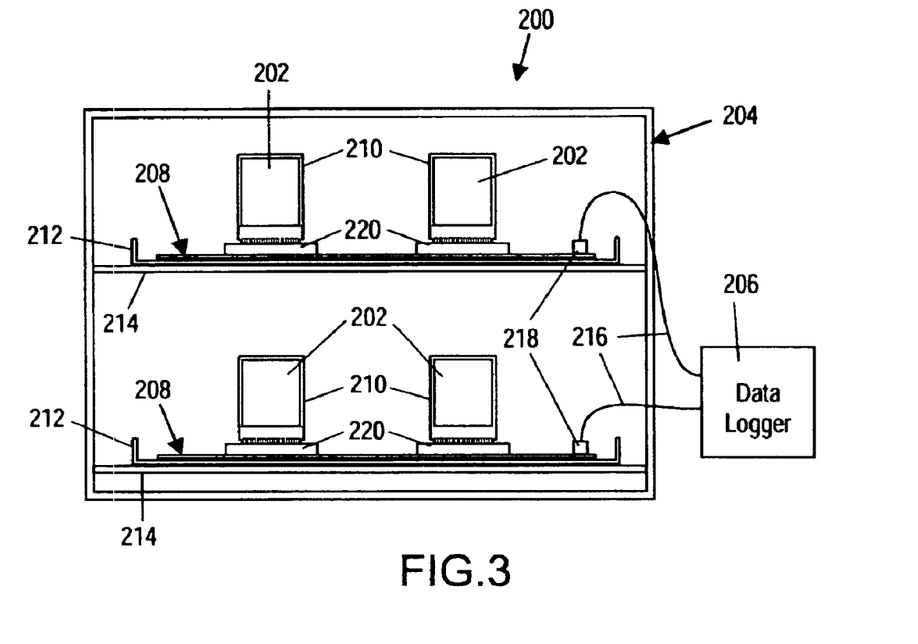
FIG. 3 is a side view of a test system including a thermal chamber with motherboards populated with IC packages according to an embodiment of the present invention.

A simplified exemplary IPC-9701 test system 200, as shown in FIG. 3, for testing IC packages 202 generally includes a thermal test chamber 204, a data logger 206, one or more motherboards 208 and printed circuit boards (PCBs) 210 (a.k.a. interposer daughter cards (IDCs)). The IC packages 202 are connected to the PCBs 210 (e.g. by surface mount solder ball grid arrays). The PCBs 210 are preferably constructed to simulate any PCBs to which the IC packages 202 will eventually be connected in a real-world situation, as opposed to a test situation. The PCBs 210 are removably connected perpendicular to the motherboards 208. The motherboards 208 are preferably placed on trays 212 stacked on shelves 214 within the thermal test chamber 204. The motherboards 208 are electrically connected (e.g. via ribbon cables 216 and ribbon connectors 218) to the data logger 206. The motherboards 208 have female card connectors 220 (or other appropriate electrical connections) into which the PCBs 210 are inserted for electrical contact with the motherboards 208 and for quick and easy removability from the motherboards 208.

The thermal test chamber 204 cycles the temperature to which the IC packages 202 (and the PCBs 210 and the motherboards 208) are subjected while the data logger 206 supplies electrical test signals to the IC packages 202. The electrical test signals generally pass through loops of chains of the external connectors of the IC packages 202, similar to the description in the background, but also through the ribbon cables 216, the ribbon connectors 218, the motherboards 208, the female card connectors 220 and the PCBs 210 The data logger 206 also monitors the electrical test signals for an indication of a failure condition in any of the IC packages 202 or PCBs 210.

For the IPC-9701 test, the data logger 206 periodically reads and records the current temperature within the thermal test chamber 204 and the electrical resistance encountered by each of the electrical test signals. When an unacceptably high resistance (i.e. a test failure) is encountered at any temperature by any of the electrical signals, the IC package 202 and PCB 210 in which the failure has occurred must be removed from the motherboard 208 in order to further test the IC package 202 and PCB 210 and narrow down the location of the cause of the high resistance reading. In an alternative, the continual reading of the temperature and resistance during the thermal cycling in the thermal test chamber 204 may be eliminated, and the thermal cycling may be followed by manual or automatic electrical testing of all of the IC packages 202 and PCBs 210.

Since the IC package 202 is mounted on one of the PCBs 210 and the PCBs 210 are removably connected to the motherboards 208 at the female card connectors 220, the IC package 202 can be quickly and easily removed from the motherboard 208 by pulling the PCB 210 out of the female card connector 220. Thus, the motherboard 208 is not cut or otherwise altered by removing the IC package 202.

The removed IC package 202 preferably remains connected to the PCB 210, so the removed IC package 202 can be returned to the motherboard 208 by reinserting the PCB 210 into the female card connector 220 if further testing in the test system 200 is desired or required for the removed IC package 202. Additionally, since the PCB 210 can be quickly and easily removed from the motherboard 208, the motherboard 208 and any other PCBs 210 and IC packages 202 can be returned without delay to the test system 200 for further testing of the other PCBs 210 and IC packages 202. Also, the motherboards 208 can be reused to test other IC packages 202 and PCBs 210. Furthermore, since the PCBs 210 are connected perpendicular, instead of parallel, to the motherboard 208, more of the PCBs 210 and IC packages 202 can potentially be placed on a single motherboard 208, which will be particularly evident with respect to the motherboard used for the HAST test described below.

Figure 4:
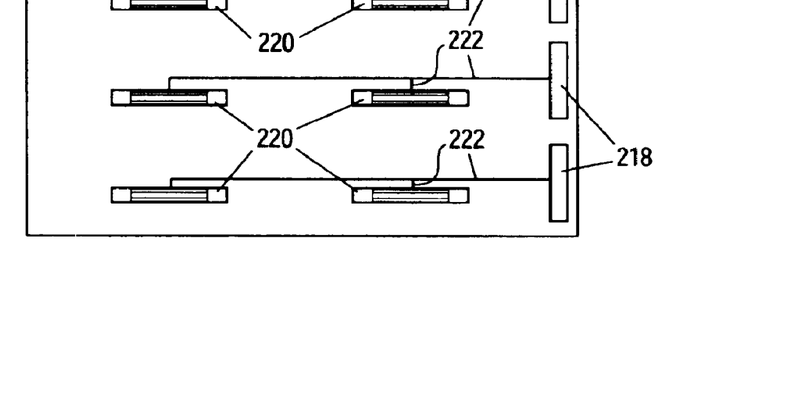
FIG. 4 is a plan view of the motherboard shown in FIG. 3.

An exemplary motherboard 208 preferably has several rows and columns of the female card connectors 220, as shown in FIG. 4. The motherboard 208 is shown with ten of the female card connectors 220, but any appropriate number and arrangement may be used. Additionally, the motherboard 208 is shown with five of the ribbon connectors 218, one for every two female card connectors 220, but any appropriate number may be used. The ribbon connectors 218 electrically connect to the female card connectors 220 via signal traces 222 on the motherboard 208.

Figure 5:
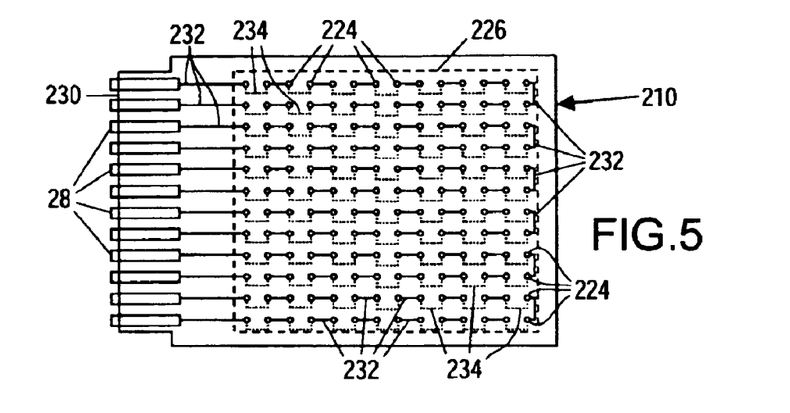
FIG. 5 is a plan view of a printed circuit board for connecting to the motherboard shown in FIG. 4 according to an embodiment of the present invention.

An exemplary PCB 210, as shown in FIG. 5, is preferably constructed to simulate any PCBs to which the IC packages 202 (FIG. 3) will eventually be connected in a real-world situation, as opposed to a test situation. The PCB 210 includes an array of surface mount pads 224 corresponding to the solder ball grid array on the IC package 202 that is to be mounted on the PCB 210. The general location of the IC package 202 on the PCB 210 is represented by a dashed line 226. Edge connectors 228 are preferably arranged on only one edge 230, but both sides, of the PCB 210, so the PCB 210 can be mounted perpendicular to the motherboard 208 (FIGS. 3 and 4). In this manner, more PCBs 210 can be placed on the motherboard 208 than could be done in the prior art. Additionally, the edge connectors 228 are electrically connected to the surface mount pads 224 by traces 232 on the PCB 210 and by package conductors (represented by dashed lines 234) through the IC package 202. In this manner, each electrical signal from the data logger 206 (FIG. 3) is transferred in a path from the edge connectors 228, through one of the traces 232, to one of the surface mount pads 224, through one of the package conductors 234 in the IC package 202, to the next surface mount pad 224, through the next trace 232, to the subsequent surface mount pad 224 and so on until the path loops back to the next edge connector 228. Thus, the surface mount pads 224 (and the solder balls on the IC package 202) are connected in chains that loop from one edge connector 228 to the next edge connector 228. The number of chains in each PCB 210 depends on the number of surface mount pads 224 and the number of edge connectors 228 on the PCB 210. The number of edge connectors 228 on each PCB 210 depends on the number of PCBs 210 that can be placed on the motherboard 208 and the number of signal channels available from the data logger 206 for each motherboard 208.

Figure 6:
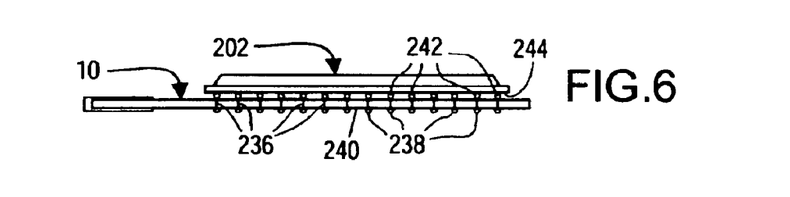
FIG. 6 is a side view of the printed circuit board shown in FIG. 5 with an IC package connected thereto according to an embodiment of the present invention.

The PCB 210 preferably has vias 236, as shown in FIG. 6, at each of the surface mount pads 224 (FIG. 5). The vias 236 connect the surface mount pads 224 to solder balls 238 on the bottom surface 240 of the PCB 210. The solder balls 238 are arrayed in a similar pattern as solder balls 242 on the bottom surface 244 of the IC package 202. When the PCB 210 is removed from the motherboard 208 (FIGS. 3 and 4), therefore, it is not necessary to remove the IC package 202 from the PCB 210. Instead, to further test the IC package 202 and narrow down the location of the cause of the high resistance reading after removing the IC package 202 and PCB 210 from the motherboard 208, a test operator may manually probe the solder balls 238 on the PCB 210. Alternatively, the IC package 202 and PCB 210 may be placed in an Automated Test Equipment (ATE), which monitors and controls test and measurement devices, keeping human interaction at a minimum.

The ATE can heat the PCB 210 and IC package 202 to test at high, low and intermediate temperatures in order to duplicate the thermal cycling that caused the failure condition, which cannot be done by the prior art manual testing method. The ATE tests continuity and reliability of signals transmitted through the IC package 202 and PCB 210 between two points (i.e. solder balls 238), including resistance measurements. The ATE portion of the testing, thus, gives a "finer" result that locates the failure condition at one external connector or one pair of external connectors, instead of the "gross" determination made with the data logger 206 (FIG. 3).

Figure 7:
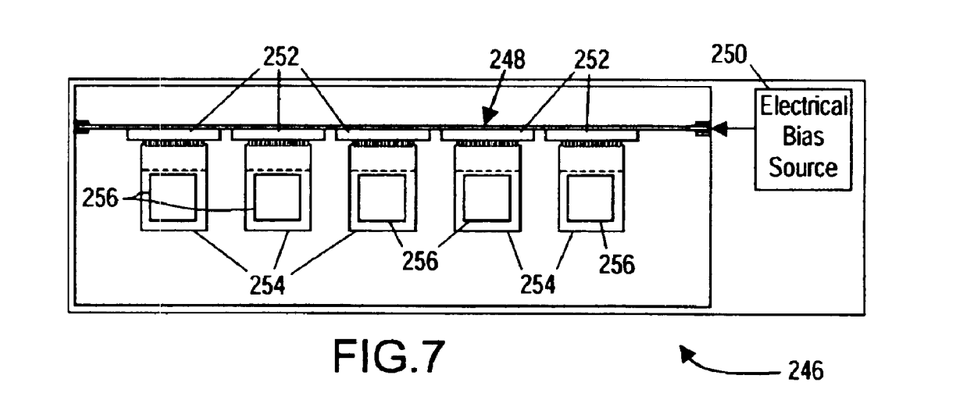
FIG. 7 is a plan view of a test chamber with a populated motherboard according to another embodiment of the present invention.

Another type of test chamber 246 is shown in FIG. 7. The test chamber 246 may be used, for example, in a Highly Accelerated Stress Test (HAST). A populated motherboard 248 is placed within the test chamber 246 and electrically connected to an electrical bias source 250. The motherboard 248 has several female edge connectors 252 into which several PCBs 254 are inserted for testing. The PCBs 254 have IC packages 256 mounted thereon (e.g. by surface mounting). The PCBs 254 are, thus, connected perpendicular to the motherboard 248, so more IC packages 256 can be placed on the motherboard 248 than could be placed on the motherboard disclosed in the above referenced US patent.

The test chamber 246 subjects the IC packages 256, the PCBs 254 and the motherboard 248 to relatively high thermal and relative humidity test conditions (e.g. about 130° C. and about 85% relative humidity) while the electrical bias source 250 applies stress electrical bias signals through the motherboard 248 and the PCBs 254 to the IC packages 256 for a period of time (e.g. about 100 hours). Afterwards, the motherboard 248 is removed from the test chamber 246, and the PCBs 254 are removed from the motherboard 248. The IC packages 256 are preferably not removed from the PCBs 254, because the PCBs 254 preferably have vias and external connectors similar to the vias 236 and the solder balls 238 of the PCB 210 shown in FIG. 6. The IC packages 256, still connected to the PCBs 254, may thus be placed in the ATE for automatic electrical testing to determine whether any of the IC packages 256 and the PCBs 254 have been significantly affected by the stress testing.

Figure 8:
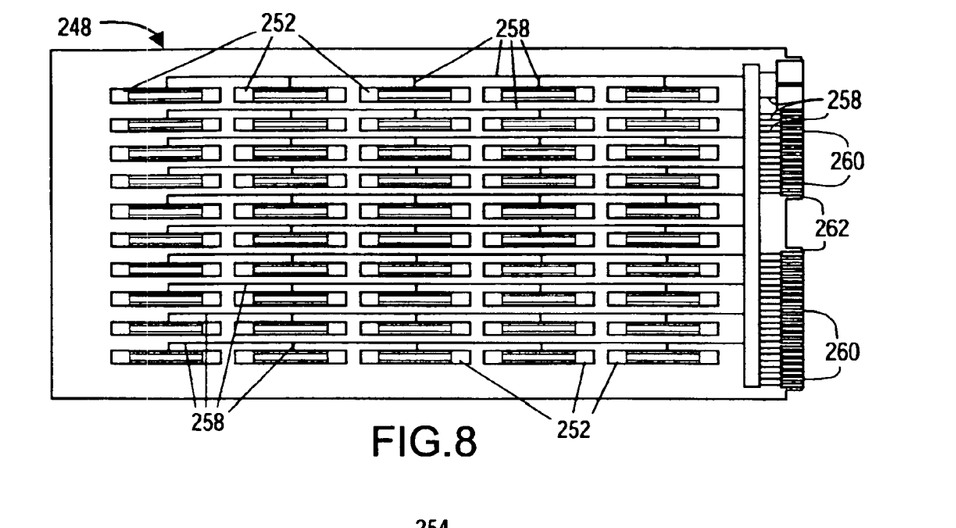
FIG. 8 is a plan view of the motherboard shown in FIG. 7.

An exemplary motherboard 248 for use in the test chamber 246 is shown in FIG. 8. The motherboard 248 preferably includes several of the female edge connectors 252 arrayed in rows and columns, so that as many of the PCBs 254 (FIG. 7) may populate the motherboard 248 as are practical or desired. The female edge connectors 252 are electrically connected via traces 258 to edge connectors 260 on an edge 262 of the motherboard 248. The edge connectors 260 electrically connect to the electrical bias source 250 (FIG. 7).

Figure 9:
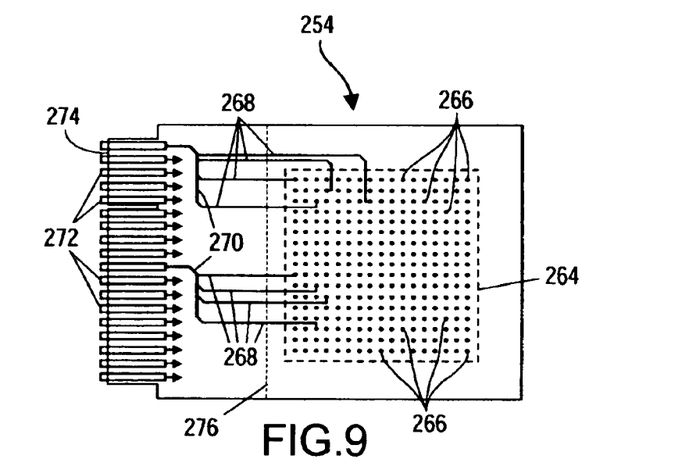
FIG. 9 is a plan view of a printed circuit board for connecting to the motherboard shown in FIG. 8.

An exemplary PCB 254, as shown in FIG. 9, is preferably constructed to simulate any PCBs to which the IC packages 256 (FIG. 7) will eventually be connected in a real-world situation, as opposed to a test situation. The PCB 254 may be inserted into the female edge connectors 252 on the motherboard 248. An IC package (represented by dashed line 264), similar to the IC packages 256, is surface mounted to the PCB 254 at connector pads 266. The connector pads 266 are electrically connected via traces 268 and bus bars 270 to edge connectors 272 preferably on only one edge 274, but both sides, of the PCB 254. Only a limited number of the traces 268 and bus bars 270 are shown for simplicity and ease of viewing the drawing. However, it is preferable that each of the edge connectors 272 be connected to multiple connector pads 266 through at least one bus bar 270 and as many traces 268 as are needed. Additionally, it is preferable to apply positive bias to the edge connectors 272 on one side of the PCB 254 and negative bias to the edge connectors 272 on the opposite side.

Each electrical path for the stress electrical bias signals supplied by the electrical bias source 250 (FIG. 7) through the motherboard 248 preferably passes from one of the edge connectors 272, through one of the bus bars 270, through multiple traces 268, to multiple connector pads 266, into the IC package (dashed line 264) at multiple external connectors, out of the IC package (dashed line 264) at other external connectors, to other connectors pads 266, through other traces 268, through another bus bar 270 and to another edge connector 272. Thus, each stress electrical bias signal passes through several loops, each loop passing through a pair of external connectors on the IC package (dashed line 264). After removing the PCBs 254 from the motherboard 248, the automatic electrical testing may use the same loops, still connected by the bus bars 270, to perform a "gross" test to generally locate any potential failures. If it is necessary to test individual loops, or pairs of external connectors on the IC package (dashed line 264), then the PCB 254 is cut along a guide line 276 between the bus bars 270 and the connector pads 266, thereby disconnecting each loop from all other loops. The automated electrical testing may then be performed on individual pairs of the connector pads 266 to perform a "fine" test to more specifically locate any potential failures.

Presently preferred embodiments of the present invention and many of its improvements have been described with a degree of particularity. This description is of preferred examples of implementing the invention, and is not necessarily intended to limit the scope of the invention. The scope of the invention is defined by the following claims.

I Claim:

1. A method of testing a subject integrated circuit (IC) package comprising:
   mounting only one subject IC package on a subject printed circuit board (PCB);
   removably connecting the subject PCB to a motherboard along with a plurality of other PCBs each having only one other IC package mounted thereon;
   exposing the subject IC package, the subject PCB, the other IC packages and the other PCBs to thermally varying test conditions;
   monitoring the subject IC package and the other IC packages for a test failure during exposure to the thermally varying test conditions;
   determining whether the subject IC package has experienced the test failure;
   upon determining that the subject IC package has experienced the test failure, removing the subject PCB from the motherboard; and
   performing an electrical test only on the subject IC package to determine a location of the test failure.

2. A method as defined in claim 1 further comprising:
removably connecting the subject PCB to the motherboard by edge card connection.

3. A method as defined in claim 2 wherein:
the subject PCB has edge card connectors on only one edge.

4. A method as defined in claim 1 further comprising:
removing the subject PCB from the motherboard without altering the motherboard.

5. A method as defined in claim 1 further comprising:
continuing the exposing and monitoring of the other IC packages and the other PCBs while electrically testing the subject IC package.

6. A method as defined in claim 1 further comprising:
returning the subject PCB to the motherboard to resume the exposing and monitoring of the subject IC package and the subject PCB.

7. A method of testing integrated circuit (IC) packages comprising:
mounting the IC packages on printed circuit boards (PCBs), each PCB having only one IC package thereon;
connecting the PCBs to a motherboard;
applying test signals to the IC packages through the motherboard and the PCBs;
subjecting the IC packages to thermal cycling;
monitoring the test signals during the thermal cycling to determine whether any of the IC packages exhibit a failure condition;
upon determining that one or more IC packages exhibit the failure condition, removing from the motherboard the PCBs to which the one or more IC packages are mounted; and
performing an electrical test on individual IC packages on the removed PCBs to determine a location of the failure condition.

8. A method as defined in claim 7 further comprising:
placing the motherboard in a thermal test chamber in which the thermal cycling occurs.

9. A method of testing integrated circuit (IC) packages comprising:
mounting the IC packages on printed circuit boards (PCBs) each having edge connectors on only one edge and only one IC package;
removably connecting the PCBs to a motherboard perpendicular to the motherboard;
applying a test electrical bias to the PCBs and the IC packages for a period of time;
removing the PCBs and the IC packages from the motherboard; and
electrically testing individual IC packages to determine whether any of the IC packages fail due to application of the test electrical bias.

10. A method as defined in claim 9 further comprising:
subjecting the motherboard, the PCBs and the IC packages to thermal and relative humidity test conditions.

11. A method as defined in claim 9 further comprising a highly accelerated stress test (HAST).

12. A method as defined in claim 9 further comprising:
placing the motherboard with the PCBs and the IC packages in a test chamber within which the test electrical bias is applied to the PCBs and the IC packages.

13. An integrated circuit (IC) package testing apparatus comprising:
a plurality of printed circuit boards (PCBs), each capable of supporting only one IC package to be tested; and
a motherboard to which the PCBs are removably connected;
and wherein:
the motherboard, the PCBs and the IC packages are adapted to be placed in a thermal test chamber within which the motherboard, the PCBs and the IC packages are subjected to thermal cycling conditions while electrical signals are applied to the IC packages through the motherboard and the PCBs and monitored for a failure condition; and
the motherboard and the PCBs are adapted to be separated for electrical testing of individual IC packages to determine a location of a cause of the failure condition.

14. An integrated circuit (IC) package testing apparatus as defined in claim 13 wherein:
the PCBs are connected substantially perpendicular to the motherboard.

15. An integrated circuit (IC) package testing apparatus as defined in claim 13 wherein:
the PCBs have edge card connections on only one edge connected to the motherboard.

16. An integrated circuit (IC) package testing apparatus as defined in claim 13 wherein:
the PCBs and the motherboard can be removably reconnected after being separated.

17. An integrated circuit (IC) package testing apparatus as defined in claim 13 wherein:
the motherboard is not damaged when the PCBs are separated therefrom.

18. An integrated circuit (IC) package testing apparatus comprising:
a plurality of printed circuit boards (PCBs), each having edge connectors on only one edge and each capable of supporting only one IC package to be tested; and
a motherboard to which the PCBs are removably connected by edge card connection;
and wherein:
the motherboard, the PCBs and the IC packages are adapted to be subjected to electrical bias test signals; and
the motherboard and the PCBs are adapted to be separated for electrical testing of individual IC packages to determine whether the electrical bias test signals caused a failure condition in any of the IC packages.

19. An integrated circuit (IC) package testing apparatus as defined in claim 18 wherein:
the PCBs are connected substantially perpendicular to the motherboard.

20. An integrated circuit (IC) package testing apparatus as defined in claim 18 wherein:
the motherboard, the PCBs and the IC packages are adapted to be subjected to a highly accelerated stress test (HAST).

* * * * *

UNITED STATES PATENT AND TRADEMARK OFFICE
CERTIFICATE OF CORRECTION

PATENT NO. : 6,954,082 B2
DATED : October 11, 2005
INVENTOR(S) : Carlo Grilletto It is certified that error appears in the above-identified patent and that said Letters Patent is hereby corrected as shown below:

<u>Title page,</u>
Item [12], delete "Grillettc" and replace with -- Grilletto --.
Item [75], Inventor, delete "Grillettc" and replace with -- Grilletto --.

Signed and Sealed this

Twenty-seventh Day of December, 2005

JON W. DUDAS
*Director of the United States Patent and Trademark Office*